(12) United States Patent
Yang et al.

(10) Patent No.: US 11,539,333 B2
(45) Date of Patent: Dec. 27, 2022

(54) RF SWITCHING

(71) Applicant: NXP B.V., Eindhoven (NL)

(72) Inventors: Xin Yang, Eindhoven (NL); Dominicus Martinus Wilhelmus Leenaerts, Riethoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/514,227

(22) Filed: Jul. 17, 2019

(65) Prior Publication Data

US 2020/0059208 A1 Feb. 20, 2020

(30) Foreign Application Priority Data

Aug. 7, 2018 (EP) .................................. 18187712

(51) Int. Cl.
*H03F 3/195* (2006.01)
*H03F 1/26* (2006.01)
*H03F 1/56* (2006.01)

(52) U.S. Cl.
CPC ............. *H03F 3/195* (2013.01); *H03F 1/26* (2013.01); *H03F 1/565* (2013.01); *H03F 2200/294* (2013.01)

(58) Field of Classification Search
CPC . H03F 3/195; H03F 1/26; H03F 1/565; H03F 2200/294; H04B 1/525; H04B 1/44; H04B 1/401; H04B 1/40
USPC ............................. 330/51, 302, 295, 124 R
See application file for complete search history.

(56) References Cited

U.S. PATENT DOCUMENTS

| 6,356,536 | B1 * | 3/2002 | Repke ................... H04B 1/48 370/282 |
| 9,479,126 | B2 * | 10/2016 | Ilkov ..................... H03F 3/19 |
| 9,559,747 | B1 | 1/2017 | Garcia et al. |
| 2014/0206301 | A1 | 7/2014 | Geddada et al. |

OTHER PUBLICATIONS

Sadhu, B., "A 28-GHz 32-Element TRX Phased-Array IC With Concurrent Dual-Polarized Operation and Orthogonal Phase and Gain Control for 5G Communications", IEEE Journal of Solid-State Circuits, vol. 52, No. 12, Dec. 2017.
Uzunkol, M., "A Low-Loss 50-70 GHz SPDT Switch in 90 nm CMOS", IEEE Journal of Solid-State Circuits, vol. 45, No. 10, Oct. 2010.

* cited by examiner

*Primary Examiner* — Khanh V Nguyen
*Assistant Examiner* — Khiem D Nguyen

(57) ABSTRACT

An RF transceiver front end includes a receiver limb including a length of transmission line, an impedance matching network, a downstream shunt switch and a downstream further receiver component and a transmitter limb. The impedance matching network is configured to transform the input impedance of the further receiver component to match the input impedance of the receiver limb when the shunt switch is open and the RF transceiver front end is operable in receiver mode. The impedance matching network is further configured to transform the input impedance of the shunt switch to present an open circuit as the input impedance of the receiver limb when the shunt switch is closed and the RF transceiver front end is operable in transmitter mode. The length of transmission line can be from zero to less than λ/4 at the operating frequency of the RF transceiver.

20 Claims, 5 Drawing Sheets

RF SWITCHING

CROSS-REFERENCE TO RELATED APPLICATIONS

This application claims the priority under 35 U.S.C. § 119 of European Patent application no. 18187712.7, filed on 7 Aug. 2018, the contents of which are incorporated by reference herein.

FIELD OF THE INVENTION

The present specification relates to switching radio frequency (RF) signals and in particular to switching in RF transceiver front ends.

BACKGROUND

RF signals are used in a variety of applications and can give rise to a number of problems many of which may be related to the relatively high frequency of RF signals, often in the GHz part of the RF frequency range.

RF signals can be particularly useful in wireless communications applications including various applications in so called 5G ($5^{th}$ generation) communications.

For example radio frequency (RF) switches are used in the RF transceiver front-end and need to be able to withstand the worst case maximum voltage swing during the signal transmission. Due to the breakdown voltage limit of individual transistors for switching, some RF transceiver front-ends commonly use a stack of multiple switching transistors in series to withstand the large voltage swing during transmission. However, with more stacked transistor switches, insertion loss will increase which degrades the total noise figure of the receiving limb of the transceiver.

An alternative approach is to use a quarter wavelength ($\lambda/4$) switch so as to avoid using the series multiple stacked transistors in the receiver limb and to ensure large signal swing sustainability. However, a drawback of a $\lambda/4$ switch is that they are suitable for use only at higher operational frequencies (for example greater than about 60 GHz). When the operational frequency is lower, then the physical length of transmission line needed to implement the $\lambda/4$ switch becomes longer. Hence, the physical transmission line increases in size and has a high insertion loss and hence degrades the receiver noise figure.

Hence, a switchable RF transceiver front end having good performance in the receiver limb would be beneficial.

SUMMARY

According to a first aspect of the present disclosure, there is provided an RF transceiver front end having an operating frequency, comprising: a receiver limb including a length of transmission line, an impedance matching network, a shunt switch arranged downstream of the impedance matching network and a further receiver component arranged downstream of the shunt switch, wherein the receiver limb has a receiver limb input impedance and the further receiver component has a further receiver component input impedance; and a transmitter limb, wherein the impedance matching network is configured to transform the further receiver component input impedance to match the receiver limb input impedance when the shunt switch is open and the RF transceiver front end is operable in receiver mode and wherein the impedance matching network is further configured to transform the input impedance of the shunt switch to present an open circuit as the receiver limb input impedance when the shunt switch is closed and the RF transceiver front end is operable in transmitter mode and the length of transmission line is less than $\lambda/4$ for the operating frequency.

In one or more embodiments, the further receiver component may be a low noise amplifier and the further receiver component input impedance may be a low noise amplifier input impedance.

In one or more embodiments, the further receiver component may be a pre-matching network and the receiver limb may further include a low noise amplifier arranged downstream of pre-matching network and wherein further receiver component input impedance is a pre-matching network input impedance.

In one or more embodiments, the impedance matching network may be configured to act as a low pass network. The low pass network may have a cut off frequency at least equal to or greater than the operating frequency. The low pass network may have a resonant frequency at least equal to or greater than the operating frequency.

In one or more embodiments, the impedance matching network may include an inductance arranged in series and a capacitance arranged in parallel.

In one or more embodiments, the capacitance may be upstream of the inductance or the capacitance may be downstream of the inductance.

In one or more embodiments, the impedance matching network may be configured to act as a high pass network. The high pass network may have a cut off frequency at least equal to or greater than the operating frequency. The high pass network may have a resonant frequency at least equal to or greater than the operating frequency.

In one or more embodiments, the impedance matching network may include a capacitance arranged in series and an inductance arranged in parallel.

In one or more embodiments, the inductance may be upstream of the capacitance or the inductance may be downstream of the capacitance.

In one or more embodiments, the length of transmission line is zero.

In one or more embodiments, the operating frequency is less than 60 GHz, 50 GHz or 40 GHz.

In one or more embodiments, the operating frequency is greater than 20 GHz.

In one or more embodiments, the operating frequency is within the range of 10 GHz to 100 GHz.

In one or more embodiments, the operating frequency is within the range of 20 GHz to 50 GHz.

In one or more embodiments, the operating frequency is within the range of 24 GHz to 45 GHz.

According to a second aspect of the present disclosure, there is provided a package including an integrated circuit, wherein the integrated circuit is configured to provide the RF transceiver front end of the first aspect and any preferred features thereof.

In one or more embodiments, the package may be a front end integrated circuit (FEIC), and in particular may be a mm wave FEIC.

According to a third aspect of the present disclosure, there is provided a wireless communication device or system including the RF transceiver front end of the first aspect or the package of the second aspect.

In one or more embodiments, the wireless communication device or system may be a time division duplex communication device or system.

According to a fourth aspect of the present disclosure, there is provided a method of operating an RF transceiver front end having a receiver limb and a transmitter limb connected to a common antenna, wherein the receiver limb includes a shunt switch arranged down stream of an impedance matching network and a further receiver component downstream of the shunt switch, comprising: opening a shunt switch in the receiver limb and matching the input impedance of the receiver limb to the input impedance of the further receiver component using the impedance matching network while receiving; and closing the shunt switch in the receiver limb and transforming the input impedance of the shunt switch to present an open circuit as the input impedance of the receiver limb using the impedance matching network while transmitted.

Features of the first aspect may also be counterpart features for the fourth aspect.

DESCRIPTION OF THE DRAWINGS

Embodiments of the invention will now be described in detail, by way of example only, and with reference to the accompanying drawings, in which.

Similar items in the different Figures share like reference signs unless indicated otherwise.

DETAILED DESCRIPTION

Figure 1:
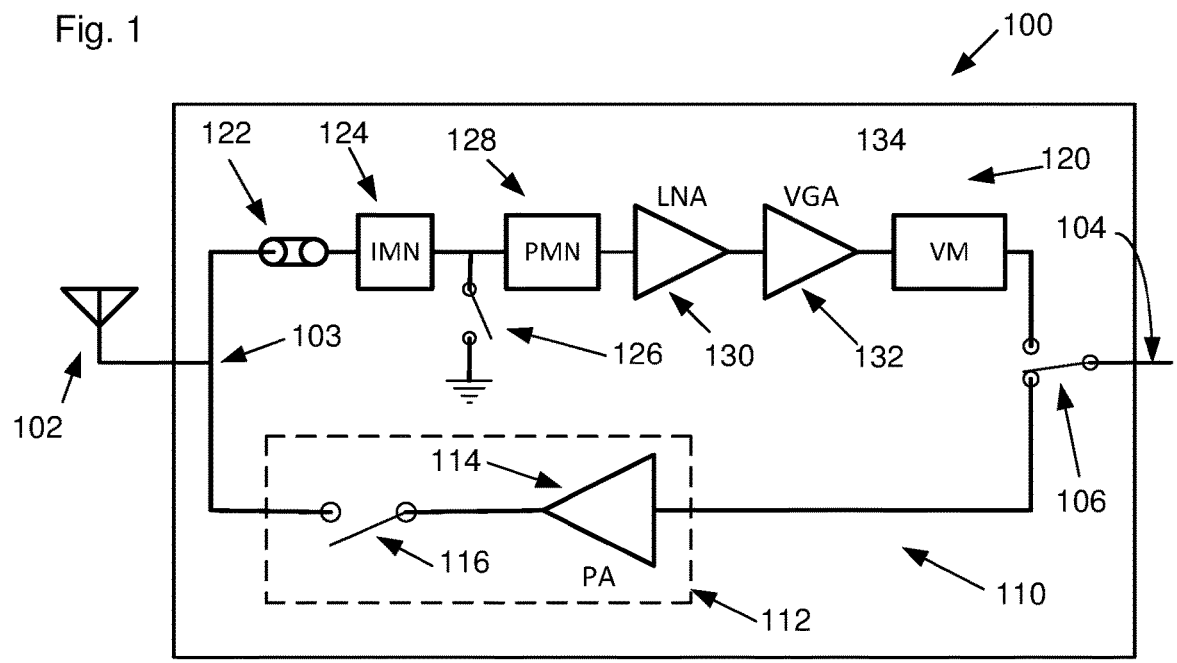
FIG. 1 shows a schematic block diagram of a first RF transceiver front end according to the invention.

With reference to FIG. 1 there is shown a schematic block diagram of an RF transceiver front end device 100 attached to an antenna 102. The front end device 100 may be in the form of an integrated circuit provided in a package. In other embodiments, the antenna 102 may also be provided as part of the integrated circuit 100. The RF transceiver front end, also sometimes referred to simply as a front end IC, also has a connection 104 for receiving and passing RF signals from other parts of a larger system which are to be transmitted via the antenna 102 or which have been received by the antenna 102. The RF signals may generally be in the range of about 20 GHz to 60 GHz.

For example, front end may be used for devices and systems complying in the 5G mm wave frequency range of 24 GHz to 45 GHz.

However, the approach can be applied more generally at frequencies high enough to allow for efficient silicon implementation, in general from 20 GHz upwards.

In some applications, e.g. phased antenna arrays, there may be a plurality of RF transceiver front ends each with a respective antenna and respective RF connection. One or more RF transceiver front-ends may be used in various application, including 5G telecommunications. The approach described herein also may be used in applications based on phased array concepts. FEICs for 60 GHz communication standards and also for E-band communication at 85 GHz.

The RF transceiver front end device 100 includes a transmission limb 110 which 30 connected between an antenna connection 103 for the antenna 102 and an RF connection switch 106 and also a reception limb 120 also connected between the antenna connection 103 and the RF connection switch 106. The RF connection switch 106 is used to selectively provide a signal path between the antenna and RF connection via either the transmission limb 110 or the reception limb 120.

The transmission limb 110 can include various components 112 as commonly provided in a transceiver and are not the focus of the present invention. For example, as illustrated in FIG. 1, the transmission components in the transmission limb may include a transmitter power amplifier 114 configured to increase the power of the RF signal prior to transmission by the antenna and also a transmitter switch 116. The transmitter switch may be operable to connect the power amplifier 114 to the antenna 102 during a transmission mode of operation and to isolate the power amplifier 114 form the antenna 102 during a reception mode of operation.

The reception limb 120 can also include various components some of which may be commonly provided in a transceiver and others of which form part of the invention as explained below.

The reception limb 120 includes a length of transmission line 122 connected to the antenna connection 103. Unlike previous RF transceiver front ends, the transmission line 122 has a length less than a quarter wavelength, λ/4, at the operating frequency of the RF transceiver front end. An impedance matching circuit 124 is provided downstream of the transmission line and then a shunt switch 126 connected to ground is provided downstream of the impedance matching network 124. In the embodiment illustrated in FIG. 1, a pre-matching network is provided downstream of the shunt switch 126 and before an amplifier 130, which may be a low noise amplifier. An output of the low noise amplifier 130 is connected to an input of a variable gain amplifier 132, the output of which is connected to a vector modulator or phase shifter 134, the output of which is connected to the RF switch 106.

Figure 2:
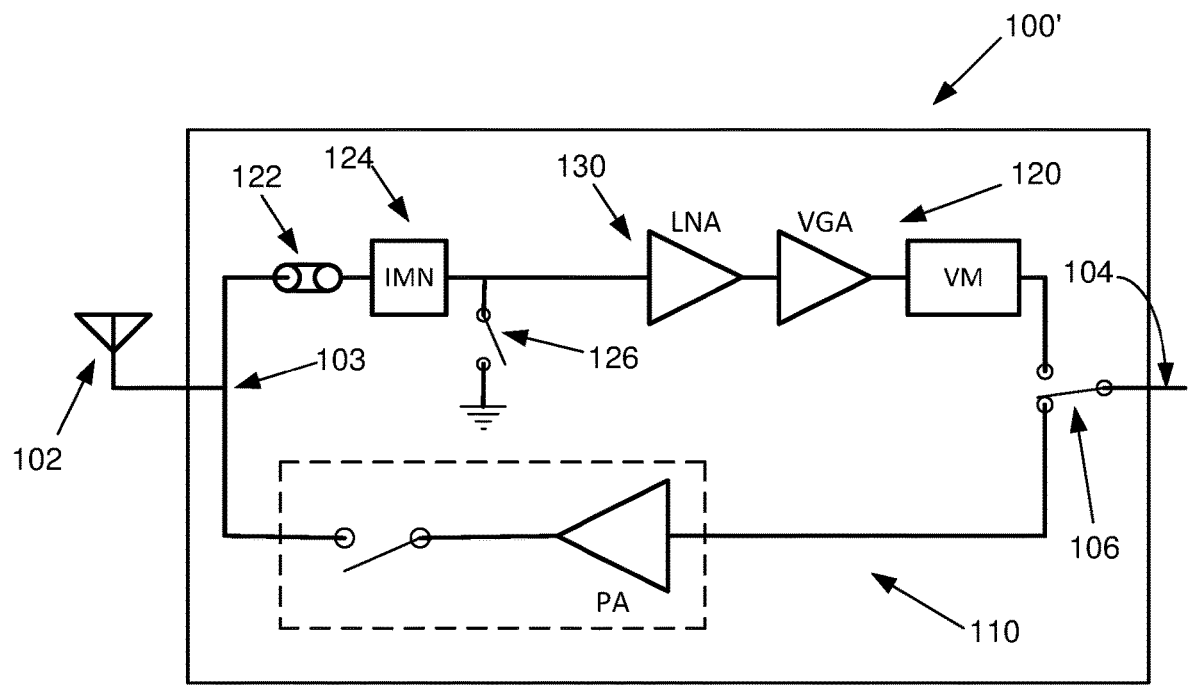
FIG. 2 shows a schematic block diagram of a second RF transceiver front end according to the invention.

FIG. 2 shows a schematic block diagram of a second RF transceiver front end device 100' generally similar to that shown in FIG. 1. However, in the second RF transceiver front end device 100', there is no pre-matching network 128 between the shunt switch 126 and the amplifier 130. Hence, in some embodiments of the invention, depending on a number of factors and including the input impedance presented by the amplifier 130, a pre-matching network 128 may not be used.

It will be appreciated that the specific receiver and transmitter components illustrated in FIGS. 1 and 2 are by way of example only and that the approach is not limited to those specific transmitter and receiver component arrangements. Rather the approach described herein relates more to the connection 103 between the transmitter and receiver limbs of the transceiver.

The illustrated line-up of impedance matching network 124, shunt switch 126 and amplifier 130 may be used to decrease the physical length of the transmission line 122 in the receiver limb to be less than λ/4 and, under some certain circumstances, the transmission line 122 can even be omitted from the receiver limb. With decreased physical length of the transmission line, the transmission line 122 has a smaller size, the receiver limb 120 has lower insertion loss and also an improved receiver noise figure. Also this approach can invention expands the operational frequency of the RF transceiver front end device to lower frequencies, for example of the order of a few GHz, e.g. 10 GHz. An upper end on the range of application may be about 100 GHz.

In the receiver limb, the shunt switch 126 is applied downstream of the impedance matching network 124 and between the impedance matching network 124 and either a pre-matching network 128, when used, or the amplifier 130. During a receiver mode of operation, with shunt switch 126 open, the pre-matching network 128 transforms the input impedance of the amplifier 130 to a specified impedance (Zpm) and the impedance matching network 124 transforms Zpm to 50Ω, being the impedance of the transmission line 122. In a transmitter mode of operation, with shunt switch 126 closed, the impedance matching network 124 transforms a very low impedance (=0Ω), provided by the closed shunt switch 126, to an inductive impedance, which decreases the physical length of transmission line that need so to be provided in order to realize an open circuit input impedance for the receiver limb 120 and hence effectively block leakage of high power RF signals into the receiver limb 120.

Figure 3:
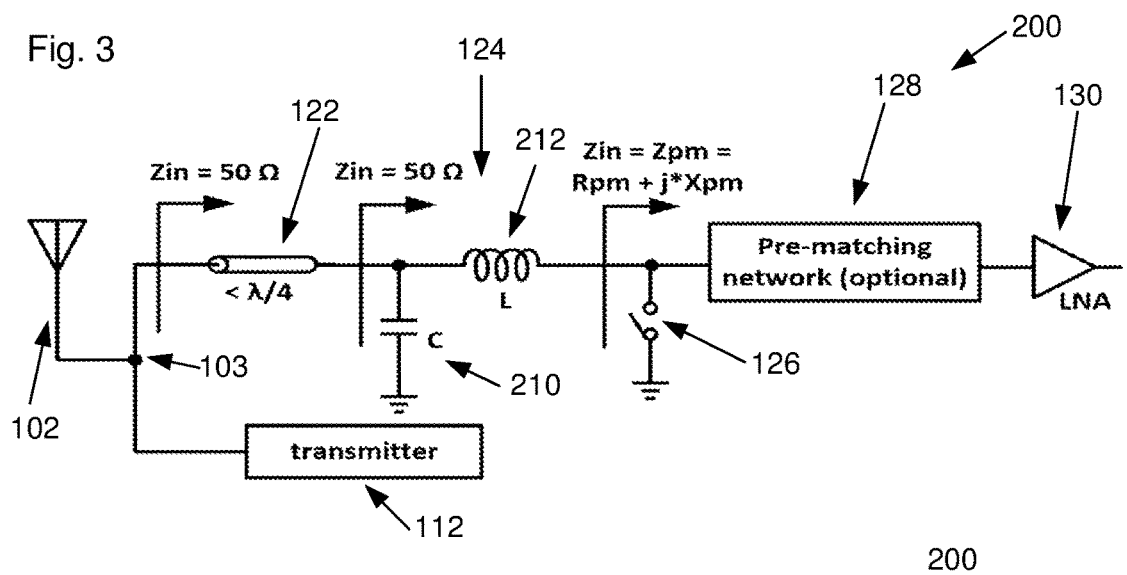
FIG. 3 shows a circuit diagram of a first embodiment of a part of the RF transceiver front end shown in FIG. 2 in a receive mode of operation.
Figure 4:
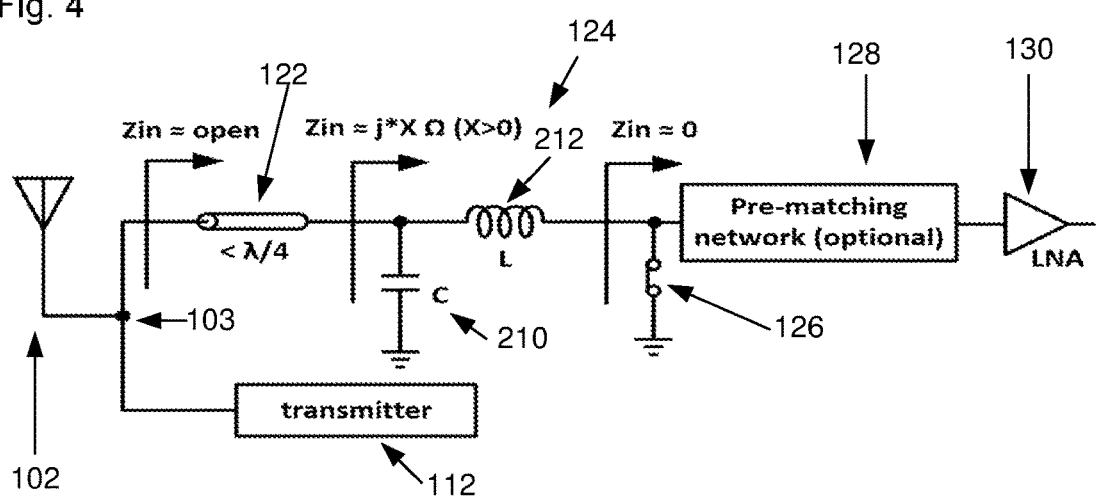
FIG. 4 shows the circuit diagram of FIG. 3 in a transmit mode of operation.

Generally, the specific value of the input impedance of the pre-matching network Zpm is not limited to a single value and may have a range of values. The specific topology of the impedance matching network 124 influences the range of values of Zpm and also the physical length of transmission line 122, as described in greater detail below. As noted above, the pre-matching network is optional and in some cases may be omitted entirely, when the input impedance of the amplifier naturally satisfies the requirement of the value of Zpm. Also, the technique is IC technology independent and can be applied for example in CMOS, BiMCOS as well as GaAs solutions FIGS. 3 and 4 respectively show a circuit diagram 200 of a first embodiment of parts of the receiver limb and the transmitter limb of the RF transceiver front end illustrated in FIG. 1 in a receive mode of operation and a transmit mode of operation. As illustrated in FIG. 3, in a receive mode of operation, the shunt switch 126 is open (and providing an open circuit) and as illustrated in FIG. 4, in the transmit mode of operation, the shunt switch 126 is closed (and providing substantially a short circuit). The impedance matching network 124 is configured to have a low pass performance. In particular, the impedance matching network includes a capacitance 210 arranged in parallel and connected to ground and an inductance arranged in series 212 and downstream of the capacitance.

The decrease of the physical length of the transmission line 122 to less than in λ/4 will now be explained. To simplify the explanation, it is assumed that the pre-matching network 128 is configured to transform the input impedance of the low noise amplifier 130 to 10Ω.

When operating in the receiver mode as illustrated in FIG. 3, the low pass LC network 124 transforms 10Ω to 50Ω and hence the input impedance $Z_{in}$ to the impedance matching network 124 is 50. In transmitter mode as illustrated in FIG. 4, the same low pass LC network 124 transforms the low impedance (almost short provided by the closed shunt switch 126) to j*100Ω. Thus, a transmission line with 0.07λ of physical length is enough to transform j*100Ω to high impedance (almost open circuit) and hence the input impedance $Z_{in}$ for the transmission line 122 and receiver limb in the transmitter mode is very large and almost open circuit. Compared to a λ/4 length transmission line approach, the physical length of the transmission line 122 in this example is only 28% (i.e. 0.07/0.25≈28%).

For the low pass impedance matching network 124 shown in FIGS. 3 and 4, the requirement of the input impedance for the pre-matching network 128 is $Z_{in}$=Zpm=Rpm+j*Xpm, where Rpm is the resistance of the pre-matching network 128 and Xpm is the reactance of the pre-matching network 128. Since the impedance matching network 124 transforms Zpm to 50Ω in receiver mode and 0Ω to inductive in transmitter mode, respectively:

$$\begin{cases} \dfrac{1}{R_{pm} + j*X_{pm} + j\omega L} + j\omega C = \dfrac{1}{50} \\ \dfrac{1}{j\omega L} + j\omega C < 0 \\ L > 0 \\ C > 0 \end{cases}$$

which can be rearranged to give:

$$\begin{cases} \dfrac{-R_{pm}}{\sqrt{\dfrac{50}{R_{pm}} - 1}} < X_{pm} < \sqrt{50 R_{pm} - R_{pm}^2} \\ 0 < R_{pm} < 50 \end{cases}$$

Figure 5:
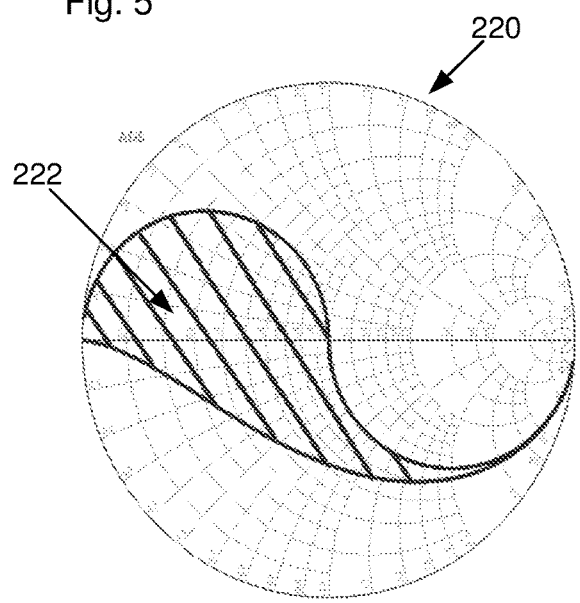
FIG. 5 shows a Smith chart illustrating possible ranges of values of the input impedance of the pre-matching network of the circuit shown in FIGS. 3 and 4.

FIG. 5 shows a plot of the range of input impedances of the pre-matching network in a Smith Chart 220 fulfilling this criterion, and wherein the shadow area 222 in FIG. 5 shows the values of Zpm which can work with the low pass impedance matching network 124 shown in FIGS. 3 and 4 to decrease the length of the transmission line 122 below λ/4.

As noted above, in some circumstances the length of the transmission line 122 can be reduced to zero and hence the transmission line 122 can be omitted form the receiver limb 120.

If, in FIGS. 3 and 4, the impedance matching network 124 transforms the input impedance of the pre-matching network 128 Zpm to 50Ω in receiver mode (FIG. 3) and transforms 0Ω to high impedance (open circuit) in transmitter mode (FIG. 4), then:

$$\begin{cases} \dfrac{1}{R_{pm} + j*X_{pm} + j\omega L} + j\omega C = \dfrac{1}{50} \\ \dfrac{1}{j\omega L} + j\omega C = 0 \end{cases}$$

which can be rearranged to give:

$$\begin{cases} X_{pm} = \dfrac{-R_{pm}}{\sqrt{\dfrac{50}{R_{pm}} - 1}} \\ 0 < R_{pm} < 50 \end{cases}$$

In this case, the impedance matching network LC circuit resonates at the operational frequency in the transmitter mode, and the transmission line length is shrunk to zero and so the transmission line 122 can be omitted.

Figure 6:
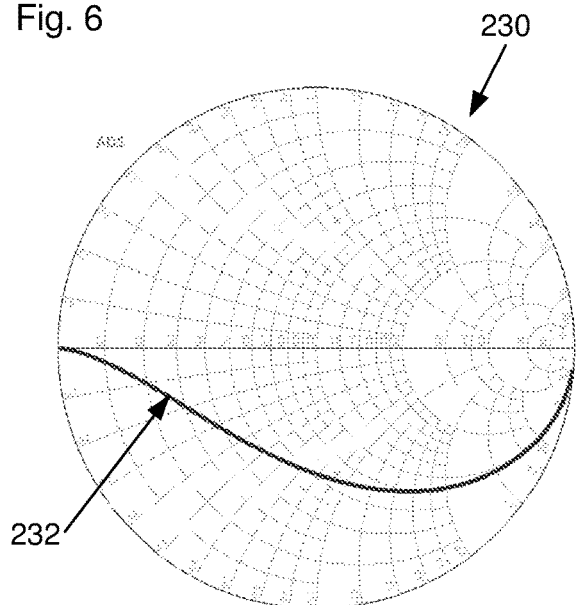
FIG. 6 shows a Smith chart illustrating a particular value of the input impedance of the pre-matching network of the circuit shown in FIGS. 3 and 4.

FIG. 6 shows a Smith Chart 230 including a plot 232 of the range of impedance values for Zpm which can work with the impedance matching network 1234 of FIGS. 3 and 4 to allow the transmission line 122 to be omitted.

Figure 7:
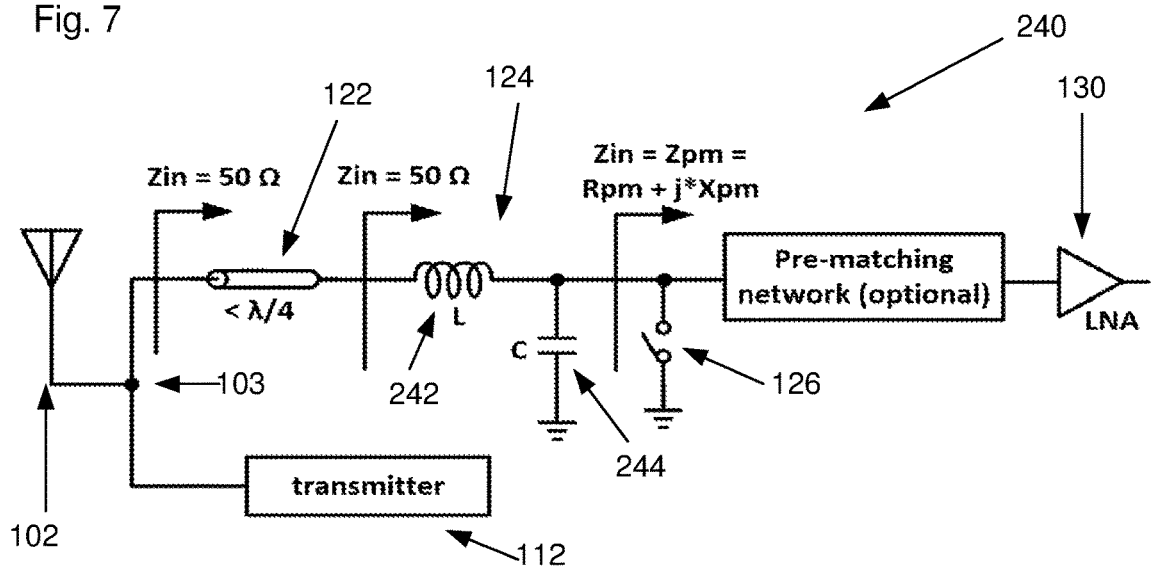
FIG. 7 shows a circuit diagram of a second embodiment of a part of the RF transceiver front end shown in FIG. 1 in a receive mode of operation.
Figure 8:
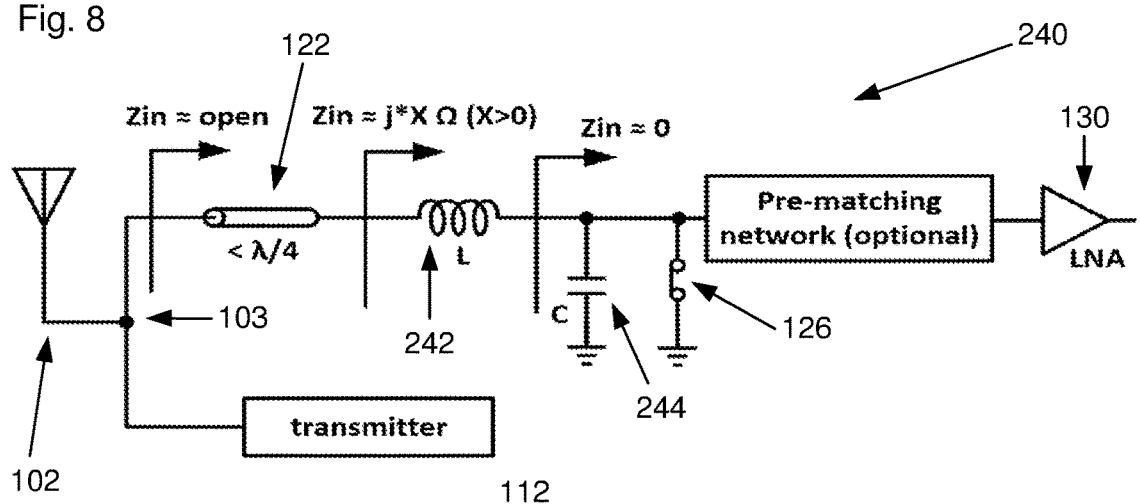
FIG. 8 shows the circuit diagram of FIG. 7 in a transmit mode of operation.

FIGS. 7 and 8 respectively show a circuit diagram 240 of a second embodiment of parts of the receiver limb and the transmitter limb of the RF transceiver front end illustrated in FIG. 1 in a receive mode of operation and a transmit mode of operation. As illustrated in FIG. 7, in a receive mode of operation, the shunt switch 126 is open (and providing an open circuit) and as illustrated in FIG. 8, in the transmit mode of operation, the shunt switch 126 is closed (and providing substantially a short circuit). The impedance matching network 124 is again configured to have a low pass performance. In particular, the impedance matching network includes an inductance 232 arranged in series and a capacitance 244 connected to ground in parallel and downstream of the inductance 244.

Similarly to the first embodiment, the low pass impedance matching network 124 transforms Zpm to 50Ω in receiver mode (FIG. 7) and transforms 0Ω to high impedance (open circuit) in transmitter mode (FIG. 8):

$$\begin{cases} \dfrac{1}{\dfrac{1}{R_{pm} + j*X_{pm}} + j\omega C} + j\omega L = 50 \\ \dfrac{1}{j\omega L} < 0 \\ L > 0 \\ C > 0 \end{cases}$$

which after rearranging gives:

$$X_{pm}^2 > 50 R_{pm} - R_{pm}^2.$$

Figure 9:
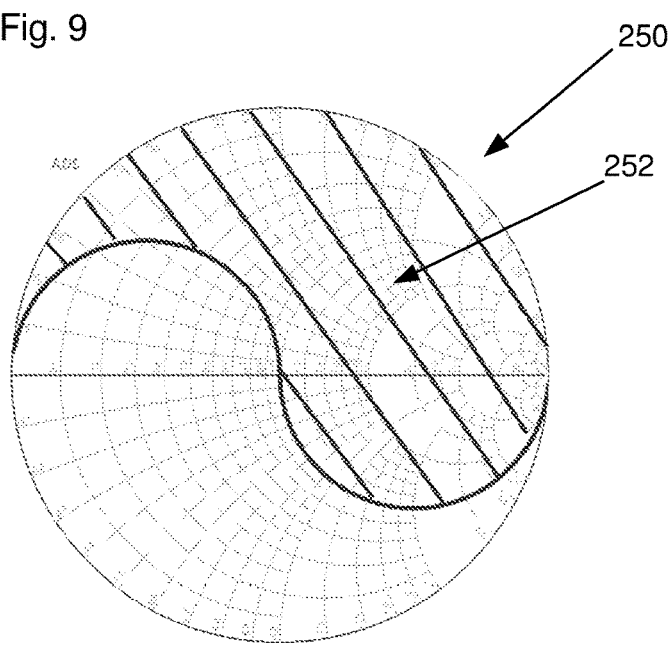
FIG. 9 shows a Smith chart illustrating possible ranges of values of the input impedance of the pre-matching network of the circuit shown in FIGS. 7 and 8.

FIG. 9 shows a Smith Chart 250, including an area 252 showing the values of Zpm which can work with the low pass impedance matching network 124 of FIGS. 7 and 8 to decrease the length of the transmission line 122 below λ/4.

Figure 10:
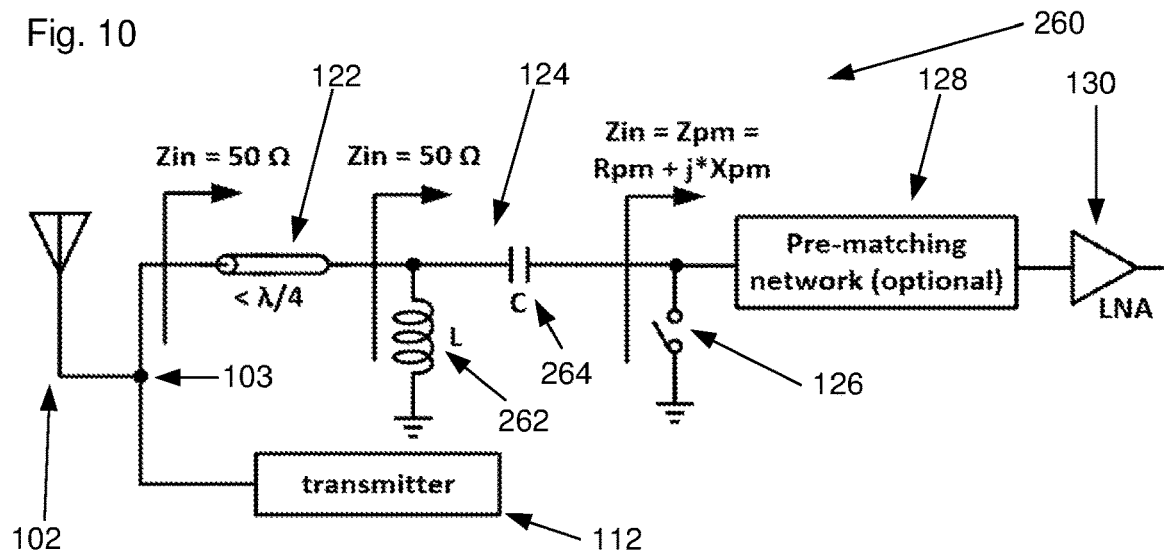
FIG. 10 shows a circuit diagram of a third embodiment of a part of the RF transceiver front end shown in FIG. 1 in a receive mode of operation.
Figure 11:
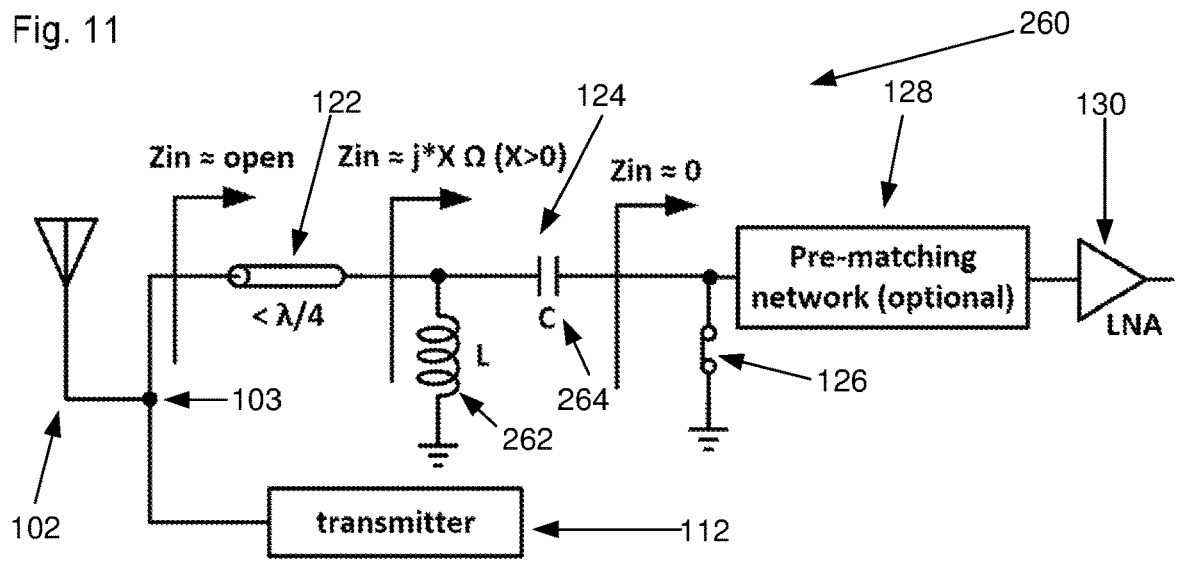
FIG. 11 shows the circuit diagram of FIG. 10 in a transmit mode of operation.

FIGS. 10 and 11 respectively show a circuit diagram 260 of a third embodiment of parts of the receiver limb and the transmitter limb of the RF transceiver front end illustrated in FIG. 1 in a receive mode of operation and a transmit mode of operation, similar to the first and second embodiments. In the third embodiment, the impedance matching network 124 is configured to have a high pass performance. In particular, the impedance matching network 124 includes an inductance 262 arranged in parallel and connected to ground and a capacitance 264 connected in series and downstream of the inductance 262.

Similarly to the first and second embodiments, the low pass impedance matching network 124 transforms Zpm to 50Ω in receiver mode (FIG. 10) and transforms 0Ω to high impedance (open circuit) in transmitter mode (FIG. 11):

$$\begin{cases} \dfrac{1}{R_{pm} + j*X_{pm} + \dfrac{1}{j\omega L}} + \dfrac{1}{j\omega L} = \dfrac{1}{50} \\ \dfrac{1}{j\omega L} + j\omega C < 0 \end{cases}$$

and after rearranging gives:

$$\begin{cases} X_{pm} > \dfrac{R_{pm}}{\sqrt{\dfrac{50}{R_{pm}} - 1}} \\ 0 < R_{pm} < 50 \end{cases}$$

Figure 12:
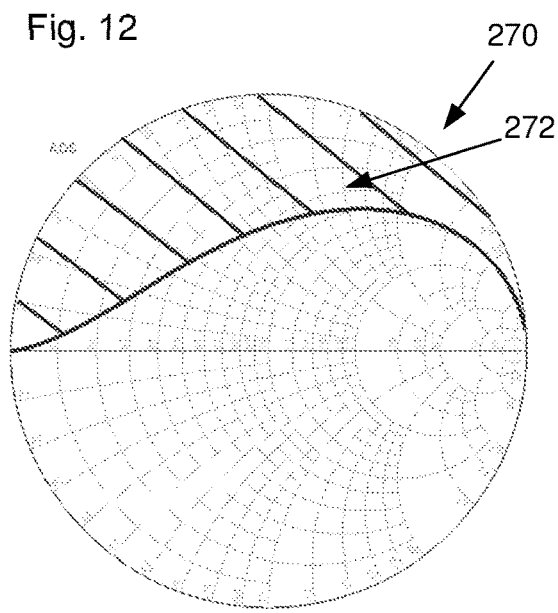
FIG. 12 shows a Smith chart illustrating possible ranges of values of the input impedance of the pre-matching network of the circuit shown in FIGS. 9 and 10.

FIG. 12 shows a Smith Chart 270, including an area 272 showing the values of Zpm which can work with the high pass impedance matching network 124 of FIGS. 10 and 11 to decrease the length of the transmission line 122 below λ/4.

The condition to shrink the length of the transmission line 122 to zero and hence omit the transmission line is:

$$X_{pm} = \dfrac{R_{pm}}{\sqrt{\dfrac{50}{R_{pm}} - 1}} \quad (0 < R_{pm} < 50)$$

Figure 13:
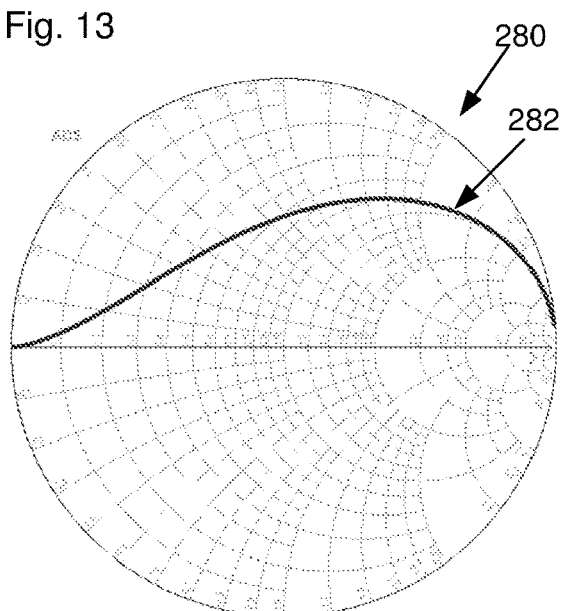
FIG. 13 shows a Smith chart illustrating possible values of the input impedance of the pre-matching network of the circuit shown in FIGS. 9 and 10.

FIG. 13 shows a Smith Chart 280, including a line 280 showing the values of Zpm which can work with the high pass impedance matching network 124 of FIGS. 10 and 11 to shrink the length of the transmission line 122 to zero and hence allow the transmission line to be omitted.

As discussed above, and as illustrated in FIG. 2, in some embodiments, the pre-matching network 128 may be omitted. In that case, the impedance matching network 124 is configured to transform the input impedance of the low noise amplifier, $Z_{lna}$ to the input impedance of the transmission line or receiver limb in receiver mode (50Ω in the above examples) and to transform OΩ to high impedance (open circuit) in transmitter mode.

In some embodiments, the RF transceiver front end 100 illustrated in FIGS. 1 and 2 can be provided in the form of an integrated circuit in a package.

Figure 14:
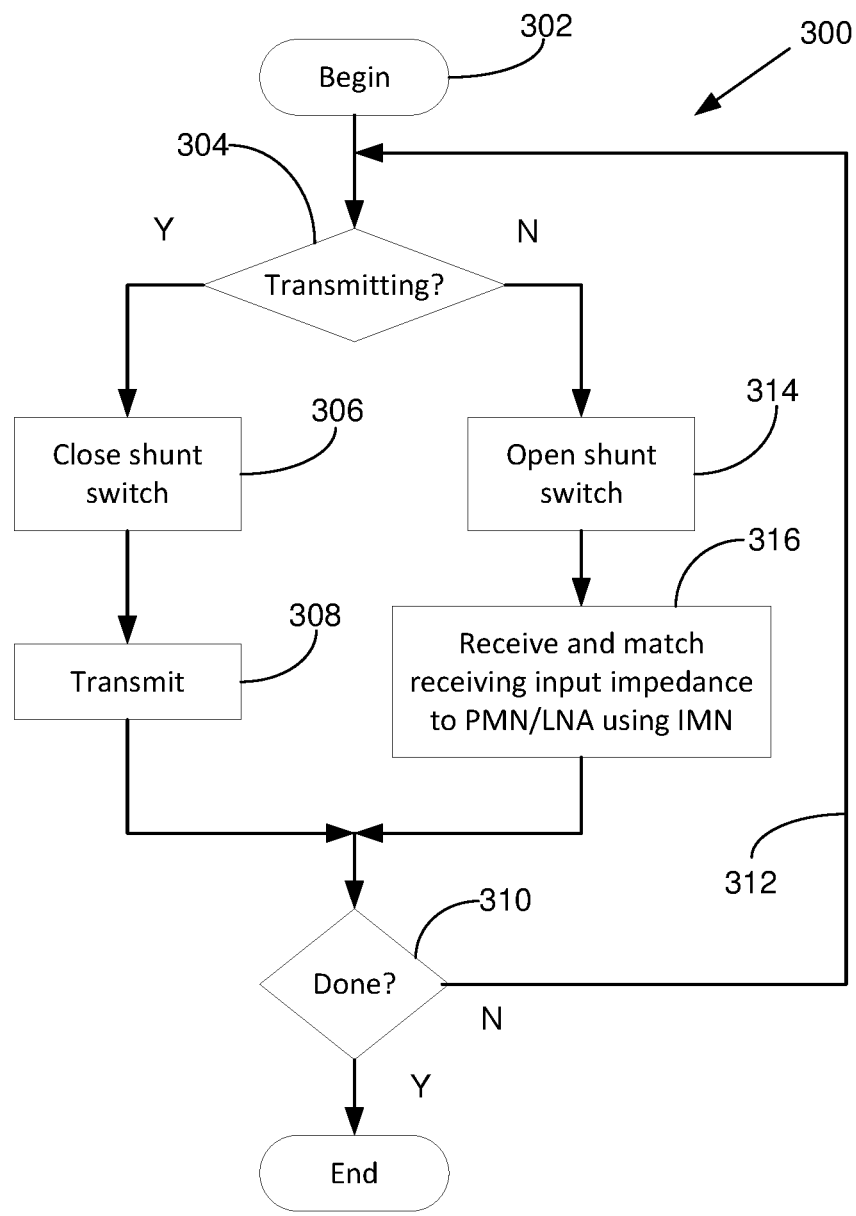
FIG. 14 shows a flow chart illustrating a method of operation of the RF transceiver front end.

FIG. 14 shows a flow chart 300 illustrating a method of operation of the RF transceiver front end. The method begins 302 with operation of the overall system of which the RF transceiver front end 100 forms a part. At 304 the system determines whether the front-end is to be used in a transmitting or receiving mode. It is determined that the front end is to be used for transmitting, then at 306 the shunt switch is closed or is maintained closed if already closed and the transmitting limb is used for transmission at 308. As explained above, the short circuit provided by the closed shunt switch is effectively transformed into an open circuit input impedance for the receiving limb by the impedance matching network and hence very little if any of the signal to be transmitted can leak into the receiving limb.

If operation of the system is determined at 310 to be continuing, the processing returns as illustrated by process flow 312 line back to 304 at which it is determined again whether the system is transmitting or receiving. If the system is receiving, then at 314, the shunt switch is opened, if previously closed, or maintained open, if previously open, and at 316, the input impedance of the receiving limb is matched to the input impedance of the downstream parts of the receiving limb, e.g. low noise amplifier 130 or pre-matching network 128, when provided, by the impedance matching network 124. Hence, the received RF signal is efficiently introduced into the receiving limb and downstream components owing to the good input impedance match between them.

The method may then continue and repeat by the system controlling the opening and closing of the shunt switch depending on whether the transceiver is in a receive or transmit mode of operation.

The technique described herein can be used in the front end of any time division duplex (TDD) system operating at high frequency. In such systems a certain switch functionality needs to be present at the antenna port, to enable receive or transmit. This technique expands the operational frequency of a $\lambda/4$ type switch from very high frequencies (>60 GHz) to lower frequencies as it allows the length of the transmission line to be reduced, in some cases to zero, and reduces insertion loss and improves the noise figure of the receiver. The reduced physical size of the transmission line also improves the ease with which the front end may be implemented as an integrated circuit.

In this specification, example embodiments have been presented in terms of a selected set of details. However, a person of ordinary skill in the art would understand that many other example embodiments may be practiced which include a different selected set of these details. It is intended that the following claims cover all possible example embodiments.

Any instructions and/or flowchart steps can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

While the disclosure is amenable to various modifications and alternative forms, specifics thereof have been shown by way of example in the drawings and described in detail. It should be understood, however, that other embodiments, beyond the particular embodiments described, are possible as well. All modifications, equivalents, and alternative embodiments falling within the scope of the appended claims are covered as well.

What is claimed is:

1. An RF transceiver front end having an operating frequency, comprising:
   a receiver limb including a length of transmission line, an impedance matching network, a shunt switch arranged downstream of the impedance matching network and a further receiver component arranged downstream of the shunt switch, wherein the receiver limb has a receiver limb input impedance and the further receiver component has a further receiver component input impedance; and
   a transmitter limb, wherein the impedance matching network is configured to transform the further receiver component input impedance to match the receiver limb input impedance when the shunt switch is open and the RF transceiver front end is operable in receiver mode and wherein the impedance matching network is further configured to transform the input impedance of the shunt switch to present an open circuit as the receiver limb input impedance when the shunt switch is closed and the RF transceiver front end is operable in transmitter mode and the length of transmission line is less than $\lambda/4$ for the operating frequency;
   wherein the impedance matching network includes an inductance arranged in series and a capacitance arranged in parallel.

2. The RF transceiver front end as claimed in claim 1, wherein the further receiver component is a low noise amplifier and the further receiver component input impedance is a low noise amplifier input impedance.

3. The RF transceiver front end as claimed in claim 1, wherein the further receiver component is pre-matching network and the receiver limb further includes a low noise amplifier arranged downstream of pre-matching network and wherein further receiver component input impedance is a pre-matching network input impedance.

4. The RF transceiver front end as claimed in claim 1, wherein the impedance matching network is configured to act as a low pass network.

5. The RF transceiver front end as claimed in claim 1, wherein the capacitance is upstream of the inductance or the capacitance is downstream of the inductance.

6. The RF transceiver front end as claimed in claim 1, wherein the length of transmission line is zero.

7. The RF transceiver front end as claimed in claim 1, wherein the operating frequency is less than 40 GHz.

8. A package including an integrated circuit, wherein the integrated circuit is configured to provide the RF transceiver front end of claim 1.

9. A time division duplex communication system including the RF transceiver front end of claim 1.

10. The RF transceiver front end as claimed in claim 1, wherein the RF transceiver front end does not include a switch between an antennae connection and the receiver limb and the antennae connection and the transmitter limb for selectively providing a path between the antennae connection and the receiver limb and the antennae connection and the transmitter limb.

11. An RF transceiver front end having an operating frequency, comprising:
    a receiver limb including a length of transmission line, an impedance matching network, a shunt switch arranged downstream of the impedance matching network and a further receiver component arranged downstream of the shunt switch, wherein the receiver limb has a receiver limb input impedance and the further receiver component has a further receiver component input impedance; and
    a transmitter limb, wherein the impedance matching network is configured to transform the further receiver component input impedance to match the receiver limb input impedance when the shunt switch is open and the RF transceiver front end is operable in receiver mode and wherein the impedance matching network is further configured to transform the input impedance of the shunt switch to present an open circuit as the receiver limb input impedance when the shunt switch is closed and the RF transceiver front end is operable in transmitter mode and the length of transmission line is less than $\lambda/4$ for the operating frequency;

wherein the impedance matching network includes a capacitance arranged in series and an inductance arranged in parallel.

12. The RF transceiver front end as claimed in claim 11, wherein the impedance matching network is configured to act as a high pass network.

13. The RF transceiver front end as claimed in claim 11, wherein the inductance is upstream of the capacitance or the inductance is downstream of the capacitance.

14. The RF transceiver front end as claimed in claim 11, wherein the operating frequency is less than 40 GHz.

15. The RF transceiver front end as claimed in claim 11, wherein the length of transmission line is zero.

16. The RF transceiver front end as claimed in claim 11, wherein the further receiver component is a low noise amplifier and the further receiver component input impedance is a low noise amplifier input impedance.

17. The RF transceiver front end as claimed in claim 11, wherein the further receiver component is pre-matching network and the receiver limb further includes a low noise amplifier arranged downstream of pre-matching network and wherein the further receiver component input impedance is a pre-matching network input impedance.

18. A package including an integrated circuit, wherein the integrated circuit is configured to provide the RF transceiver front end of claim 11.

19. A time division duplex communication system including the RF transceiver front end of claim 11.

20. The RF transceiver front end as claimed in claim 11, wherein the RF transceiver front end does not include a switch between an antennae connection and the receiver limb and the antennae connection and the transmitter limb for selectively providing a path between the antennae connection and the receiver limb and the antennae connection and the transmitter limb.

* * * * *